United States Patent [19]

Mitchell, Jr.

[11] Patent Number: 4,676,564

[45] Date of Patent: Jun. 30, 1987

[54] ACCESS DEVICE UNIT FOR INSTALLED PIN GRID ARRAY

[75] Inventor: John W. Mitchell, Jr., Pasadena, Calif.

[73] Assignee: Burroughs Corporation, Detroit, Mich.

[21] Appl. No.: 791,958

[22] Filed: Oct. 28, 1985

[51] Int. Cl.[4] .............................................. H01R 9/09
[52] U.S. Cl. ....................................... 439/77; 439/721
[58] Field of Search ............. 339/17 F, 17 M, 17 CF, 339/150 B, 151 B, 113 R, 113 B, 113 L; 361/398, 406; 324/73 PC

[56] References Cited

U.S. PATENT DOCUMENTS

| | | | |
|---|---|---|---|
| 3,701,964 | 10/1972 | Cronin | 339/17 F |
| 3,836,415 | 9/1974 | Hildebrandt | 339/148 |
| 3,899,231 | 8/1975 | Bray | 339/275 B |
| 3,970,802 | 7/1976 | Nijman | 339/17 M |
| 3,989,338 | 11/1976 | Gosser | 339/113 R |
| 4,121,044 | 10/1978 | Hadersbeck et al. | 174/68.5 |
| 4,435,740 | 3/1984 | Huckabee et al. | 361/398 |

FOREIGN PATENT DOCUMENTS

| | | | |
|---|---|---|---|
| 57-8463 | 1/1982 | Japan | 324/73 PC |
| 1188520 | 4/1970 | United Kingdom | 339/17 F |

OTHER PUBLICATIONS

IBM Bulletin, Roche, vol. 6, No.8, p. 87, 1–1964.
IBM Bulletin, Auletta, vol., 18, No. 11, p. 3591, 4–1976.

Primary Examiner—Neil Abrams
Attorney, Agent, or Firm—Alfred W. Kozak; Nathan Cass

[57] ABSTRACT

A flexible thin film plastic access unit for placement under a pin grid array installed on a printed circuit board. The access unit provides extending exterior flaps having probe-accessible contact pads which connect electrically to each one of the underside pins of the pin grid array and permit identification of each pin that is probed.

9 Claims, 5 Drawing Figures

FIG.2. Access Device Unit.

FIG. 4A. Typical Interior Pad.
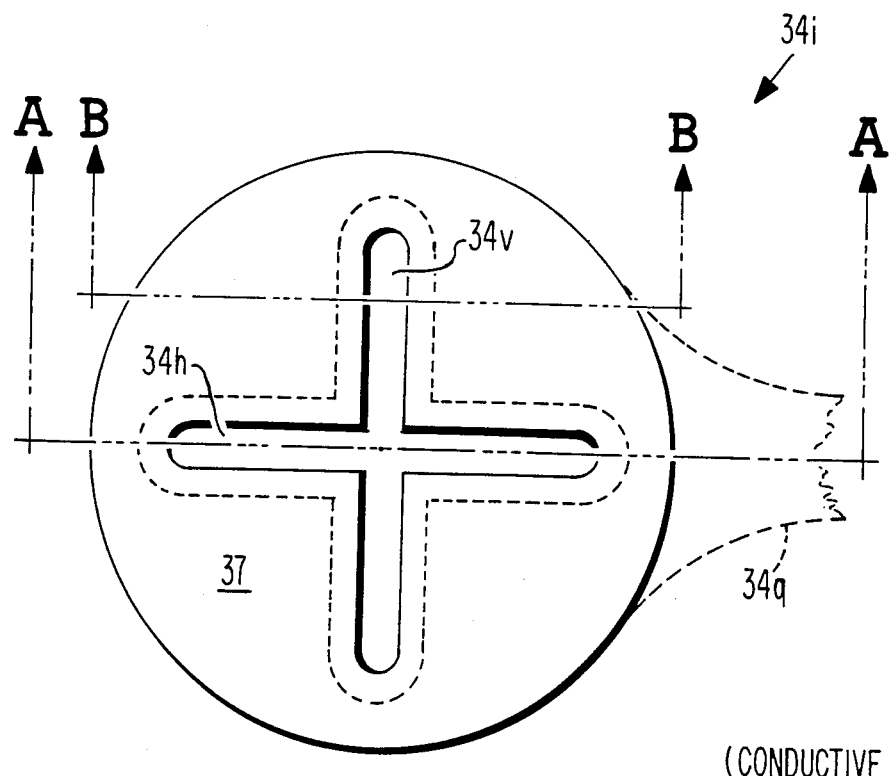
FIG. 4A-AA.
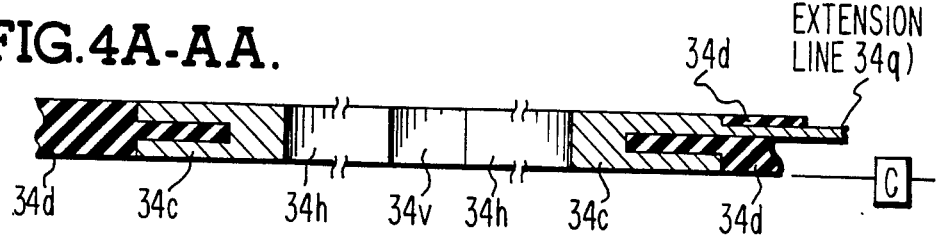
FIG. 4A-BB.
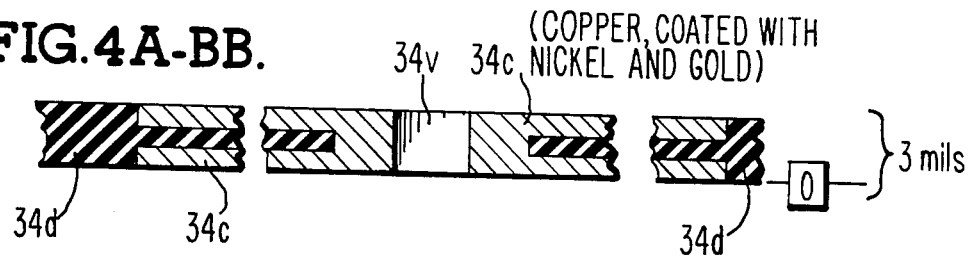
 DIELECTRIC      CONDUCTOR

FIG.4B. Typical Perimeter Pad (Exterior).
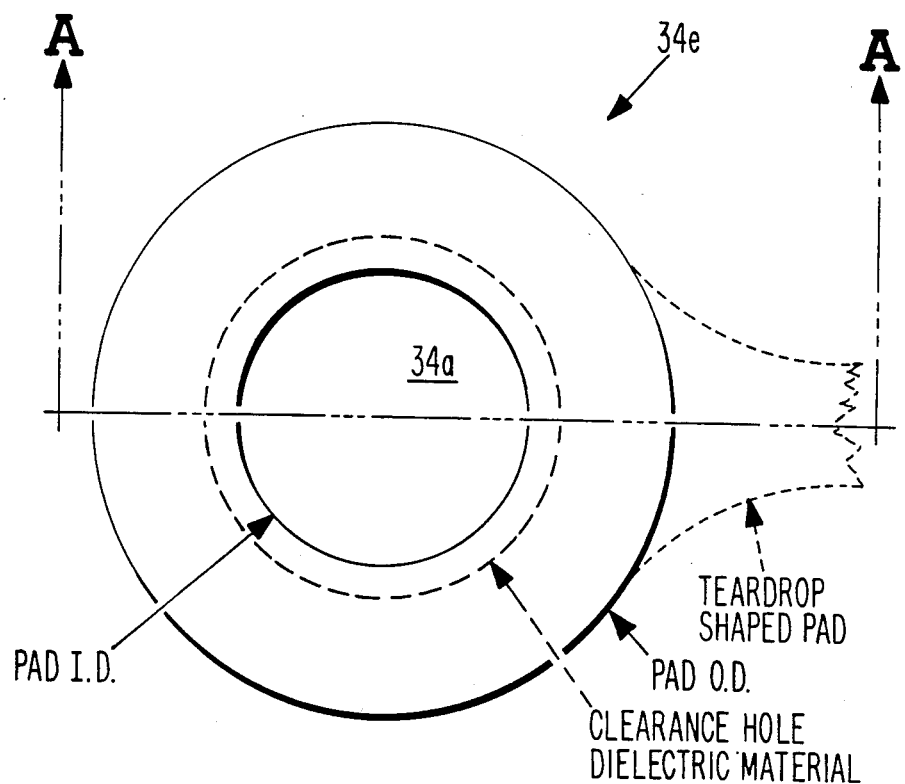
FIG.4B-AA.
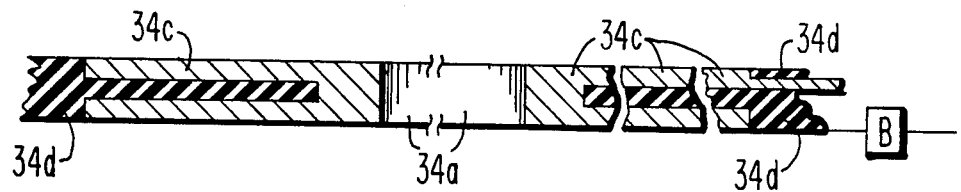
 DIELECTRIC     CONDUCTOR

ACCESS DEVICE UNIT FOR INSTALLED PIN GRID ARRAY

FIELD OF THE INVENTION

This disclosure pertains to the field of printed circuit boards and the components residing thereon for purposes of providing apparatus to enable electrical accessibility for testing points of an inserted pin grid array unit.

CROSS REFERENCES TO RELATED APPLICATION

This application is related to a co-pending application entitled "Flexible Access Connector With miniature Slotted Pads", inventor John W. Mitchell, Jr., U.S. Ser. No. 791,957, filed Oct. 28, 1985.

BACKGROUND OF THE INVENTION

Modern circuit technology involves the primary usage of printed circuit boards upon which multiple components are mounted. One of the major uses of printed circuit boards is for the mounting of pin grid array units which provide an integrated circuit having multitudinous connections which are output through connector pins on the underside. These pin grids arrays are mounted via the underside pins onto a printed circuit board and soldered (or inserted in sockets placed in the circuit board) into place in such a close knit fashion that it is practically impossible to make access contact with the underside pins once they are mounted on the printed circuit board.

It is very desirable and sometimes essential that there be methods of probing the pins of a pin grid array that is soldered or attached to a circuit board. One method for accessing the pins of the pin grid array is to access them from the solder side of the board. However, as obvious as this may seem, this method of access is not feasible due to the situation where the solder side is not accessible for probing due to proximity of other printed circuit boards and also the difficulty in locating and spotting specific pin locations in a relatively inaccessible area.

Another method of probing the pins of a pin grid array is to use what are known as "scratch pads" on the top surface of the pin grid array. However, again there are disadvantages and problems involved in this method, since "scratch pads" for probing may have to be built into the pin grid array by the manufacture at additional expense. In this situation, each scratch pad is etched on the top of the pin grid array and is connected to a corresponding pin via internal interconnections. This adds considerable expense to the pin grid array unit. And again unfortunately, in actual usage, the top surface of a pin grid array must very often be used to mount a heat sink which then makes access to the added scratch pads an impossibility.

In order to solve these various problems of pin probe accessibility in an economic and efficient manner, the present disclosure presents an access device unit printed on a flexible film circuit. This device is inserted between the printed circuit board and the pin grid array. Thereafter any inaccessible pin can be accessed by attaching a probe to the appropriate perimeter (external) contact pad on the flexible circuit which provides electrical connection to the underside pins of the pin grid array.

SUMMARY OF THE INVENTION

In order to provide probe accessibility to any one of a multiple number of pins of a pin grid array, the present disclosure provides for a small flexible polyimide film which has circuit connections from the underside of each pin of the pin grid array over to external flaps which have corresponding contact points into which a probe may be inserted to make electrical contact.

The flexible film circuit provides a series of interior contact pads which correlate with and match the locations of each pin of the pin grid array. Each of these interior contact pads is connected electrically by a thin film circuit line to a corresponding exterior contact pad on which are located external flexible flaps along the side edges of the pin grid array. These external contact pads are identified by a row and column so that each external contact pad can be correlated to each individual "internal" contact pad. Each contact pad is "symmetrical" in that a conductive layer sits on both sides of each contact pad, thus enabling pin insertion from either side.

Each of the interior contact pads are made with central slotted apertures which are placed at right angles to each other so that insertion of the pin probe from the pin grid array will penetrate the interior contact pad while at the same time providing for a tensioned pressure against the pin to make a suitable electrical contact.

BRIEF DESCRIPTION OF THE DRAWINGS

FIG. 4A is a top plan view of the "interior" contact pad illustrating the slotted apertures which run vertical and horizontal, together with a set of two cross-sectional views;

FIG. 4B shows a top plan view of the "exterior" contact pad and one cross-sectional view.

DESCRIPTION OF THE PREFERRED EMBODIMENT

Figure 1:
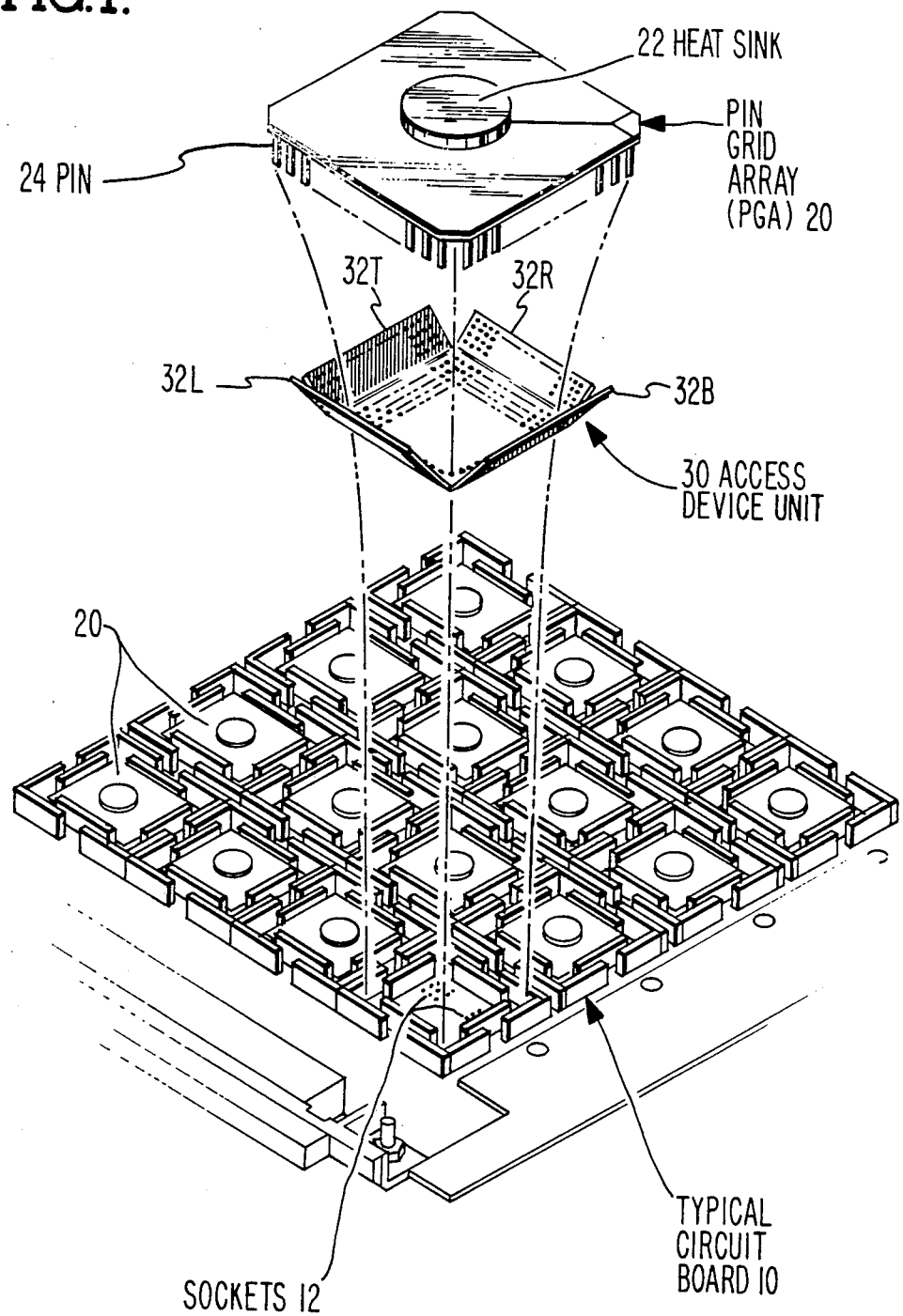
FIG. 1 illustrates in an exploded view the situation whereby a typical printed circuit board which is used to mount pin grid arrays may have an access device unit placed under the pin grid array.

Referring to FIG. 1, there is seen a typical circuit board 10 in which various areas of real estate have been allocated for the insertion of pin grid arrays such as pin grid array 20. In typical usage, the pin grid array 20 will often have a heat sink device 22 to permit heat dissipation for the array unit. Very often the heat sink will be much larger and cumbersome than that shown in the drawing of FIG. 1. In any case the heat sink will preclude the use of a top surfaced "scratch pad".

As further seen in FIG. 1, the printed circuit board 10 will have sockets 12 soldered to the board as shown, in order to receive the pins 24 which can be inserted into the apertures of the sockets 12.

The access device unit 30 shown in FIG. 1 is mounted underneath the pin grid array 20 so that it will rest between the circuit board land area and the pin grid array itself. However, each of the pins 24 of the pin grid array 20 can penetrate through the "interior" contact pads (34$_i$ of FIG. 2) and thence penetrate the apertures of the sockets 12 to make contact with the underside of the printed circuit board as seen in FIG. 3.

Figure 2:
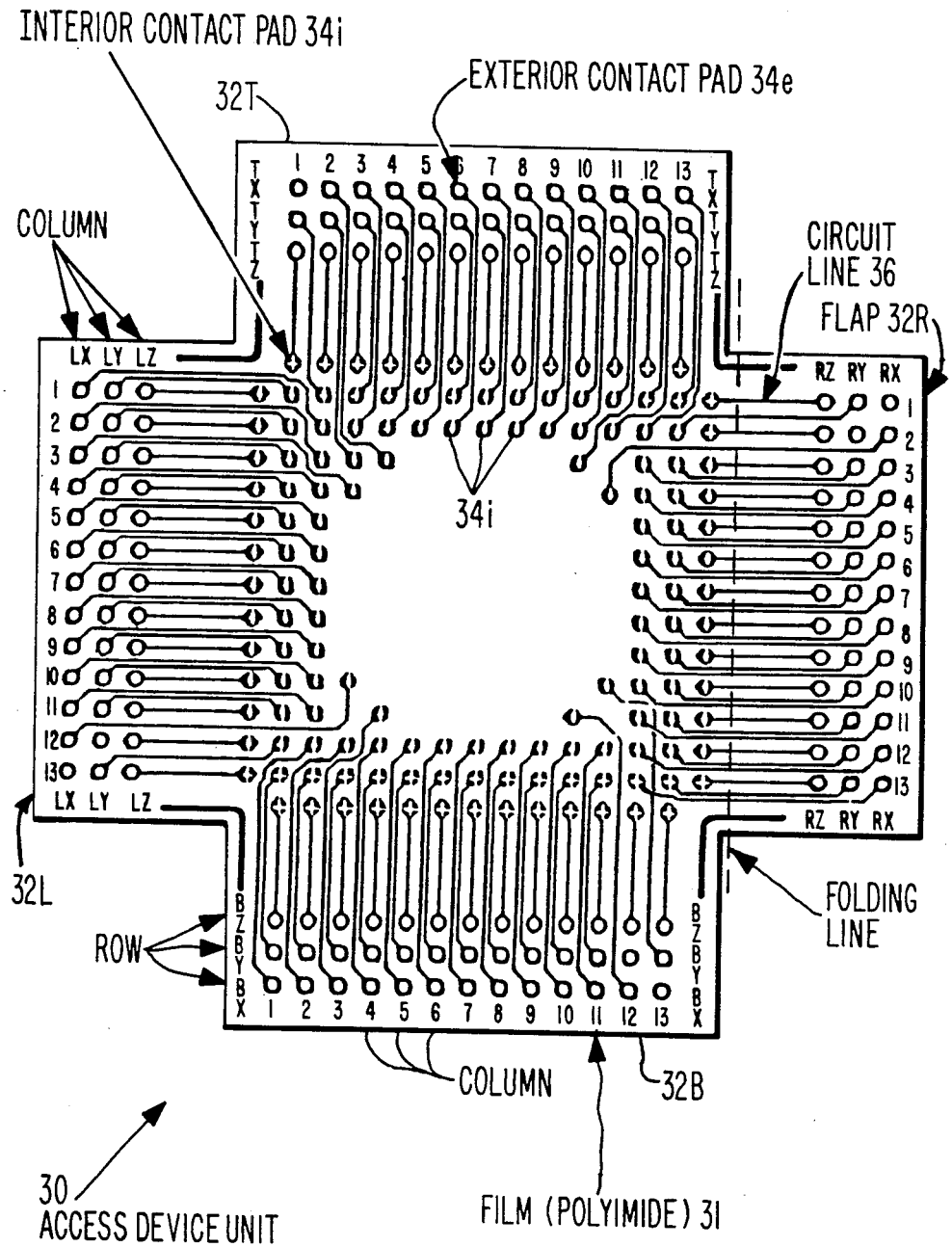
FIG. 2 is a blown-up illustration of the access device unit which is provided by a thin film of plastic such as polyimide.
Figure 3:
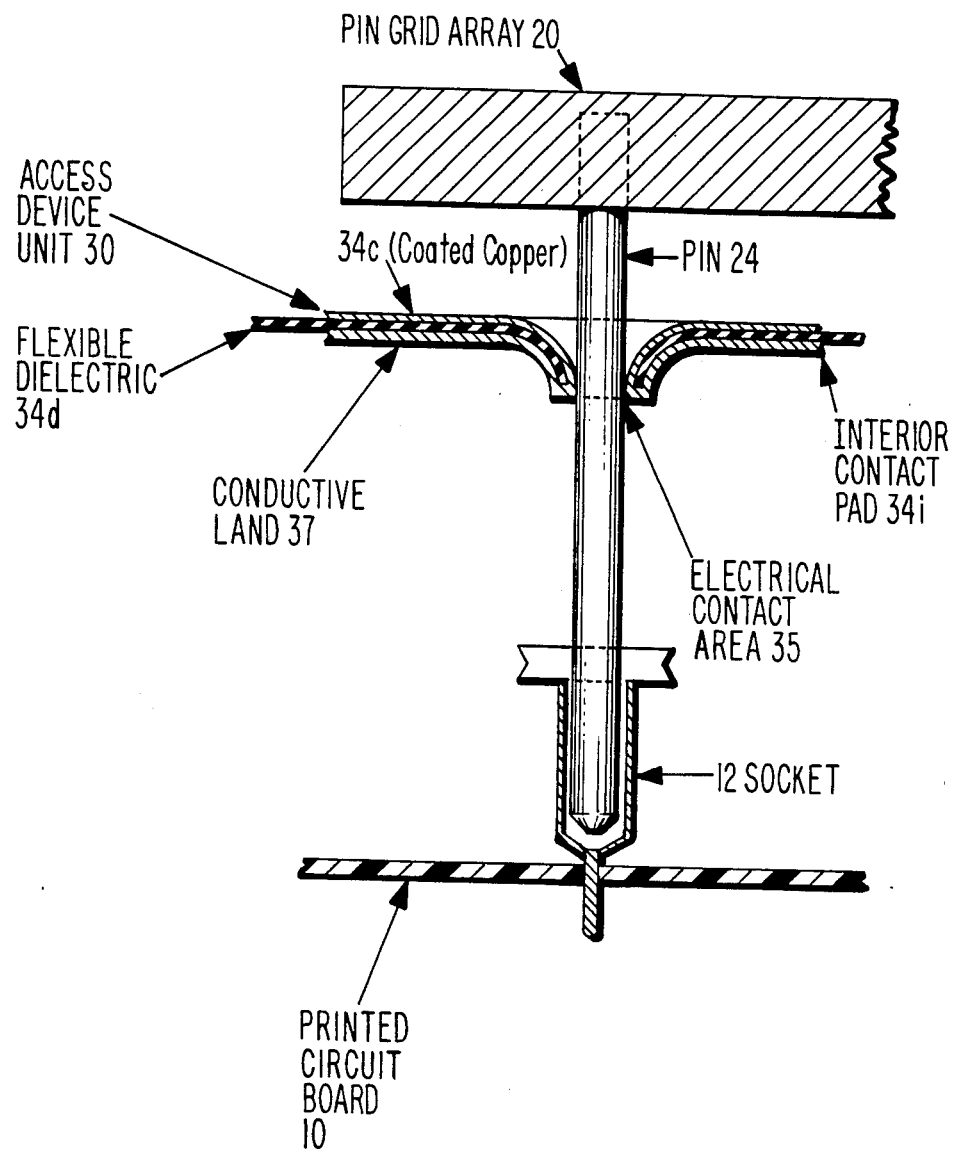
FIG. 3 is a cross-sectional view of a single pin of a pin grid array as it is used to penetrate the interior contact pad.

FIG. 2 illustrates an expanded layout of the access device unit 30 of FIG. 1. The access device unit 30 is a flexible film circuit made up of alternating layers of polyimide film which uses copper, nickel and gold to provide the "interior" contact pads $34_i$ and the "exterior" (perimeter) contact pads $34_e$.

The polyimide film is known under the tradename of Kapton as produced and manufactured by E.I. DuPont and DeNemours and Company of 1007 Market Street, Wilmington, Del. 19898. This film has an approximate thickness of 5 mils plus or minus 2 mils. This figure in inches would be designated as 0.005 inches or 5/1000ths of an inch plus or minus 2/1000ths of an inch tolerance.

In FIG. 2 the polyimide film 31 is shown supporting a series of exterior contact pads $34_e$ and an interior set of contact pads $34_i$. The set of interior contact pads $34_i$ are patterned to form a set of locations which correlate with the pins 24 of the pin grid array 20. Thus, when the pin grid array 20 is inserted into the sockets (12) mounted on the printed circuit board each pin of the pin grid array will contact and correlate to a specific interior contact pad pf the access device unit.

As seen in FIG. 2, each of the interior contact pads $34_i$ is connected by a circuit line 36 onto an exterior contact pad $34_e$. The exterior contact pads $34_e$ will be seen to reside on a set of four flaps designated as flap 32R, flap 32T, flap 32L, and flap 32B.

These flaps are easily flexed upward in order to make them easily available for probing any given contact pad with an exterior probe unit. This can be seen in FIG. 1 where the access device unit 30 is shown with the flexible flaps bent upward for easy access with a probe.

As will be noted in FIG. 2, each flap is identified according to row and column designations so that it can be easily seen and accessed with a probe unit in order to make contact with any given pin on the underside of the pin grid array. Thus referring, for example, to flap 32L, it will be seen that there are three columns designated as LX, LY and LZ. Each of these columns can further be identified by a series of row numbers which go from row 1 through row 13. Similarly the flap 32R has columns designated RZ, RY and RX together with rows 1 through 13. The flap 32T is shown as having rows TX, TY and TZ and columns 1 through 13 which is similar to flap 32B which has rows BZ, BY and BX, together with columns 1 through 13.

FIG. 3 illustrates how an underside pin 24 of pin grid array 20 is connected to the printed circuit board 10 through a socket 12. The access device unit 30 is placed to reside under the pin grid array 20 and thus permits the exterior contact pads $34_e$ (FIG. 2) to be accessible for electrical probes.

In FIG. 3 the "interior" contact pad $34_i$ is seen being able to "flex" against the pin 24 to establish a contact area 35 with a pressured spring force. This pressured spring force is accomplished by specialized conductive lands 37 which are formed of a metal laminate. As seen in FIG. 3, this metal laminate involves a central layer of flexible dielectric (such as the mentioned Kapton) which is covered by a plated copper layer as described in connection with FIGS. 4A and 4B. Basically the metal laminate is a sandwich of a polyimide central layer covered over and under by a copper layer which is plated over with a nickel layer and a gold layer.

Referring to FIG. 4A, there is shown a top plan view of the interior contact pad $34_i$. This "interior" contact pad $34_i$ must be contrasted with the "exterior" contact pad $34_e$. The exterior contact pad $34_e$ (FIG. 4B) is a metallic ring with a relatively large circular internal aperture $34_a$ as can be also seen in FIG. 2. On the other hand, as seen in FIG. 2 and particularly in FIG. 4A, the interior contact pad $34_i$ has a large land area 37 which has two slotted apertures. These apertures may preferably be at right angles to each other such as shown at $34_v$ and at $34_h$ which show a vertical slotted aperture and a horizontal slotted aperture. Other geometric forms of aperture may also be provided in the contact pad design if they provide a comparably solid and resilient electrical contact area.

The conductive resilient land area 37 of FIG. 4A (and FIG. 3) is seen in more detail in the cross-sections designated A—A and B—B. Here the copper conductor $34_c$ provides a sandwich over the dielectric $34_d$ which preferably is formed of the mentioned Kapton polyimide. The copper layer is preferably coated with 0.05 mils of nickel over which is placed a layer of gold which is 0.03 mils thick. As will be observed in FIGS. 4A and 4B the conductive land area 37 has "upper" and "lower" coatings $34_c$ surrounding the central substrate $34_d$ at the contact pad configuration.

The coatings $34_c$ are preferably 1 mil thick and surround the 1 mil dielectric central substrate on either side.

This provides "symmetry" to the contact pads $34_i$ and $34_e$ so that the IC pins or test probes can be inserted from either side of the access device. Thus, the device is not "polarized" to limit pin insertion from one side only. There is no worry about orienting the access device into a "proper" or one side orientation.

In the preferred embodiment, the outside diameter (FIG. 4A) of the conductive land 37 is 60 mils plus or minus 2 mils, while the width of the slotted area ($34_v$, $34_h$) is 4 mils. The length of each of the slotted areas is preferably 44 mils plus or minus 2 mils.

The resiliency of the conductive land must be sufficient to form a constant pressure against the pin 24 to provide a good electrical contact. At the same time it must not be so brittle as to fracture when the pin 24 is either inserted or when the pin 24 is removed. The conductive land is designed to maintain its resiliency during usage with the insertion of the pin grid array 20.

The access device unit 30 with its conductive lands is generally used just once for test purposes and then discarded after the tests are performed. Since this flexible and convenient access unit is so relatively inexpensive, it readily solves the temporary function of permitting maintenance tests under operating conditions of the printed circuit board.

FIG. 4B illustrates the preferred embodiment of the exterior contact pad $34_e$, also called the perimeter pad. The plan view shows the preferred outside diameter of 60 mils with an inner circular aperture opening of 30 mils diameter ($34_a$). The cross-section A—A shows aperture $34_a$ surrounded by the conductive copper layers $34_c$ which sandwich the dielectric $34_d$. The copper layer $34_c$ is provided with a cover layer of nickel which itself is covered by a thin gold layer of thickness as previously described in connection with FIG. 4A.

There has been described herein a simple, efficacious and inexpensive access device unit which makes possible the probing of and access to pins of an installed pin grid array on a printed circuit board. Thus, it is possible that testing and maintenance can easily be effectuated without recourse to the solder side of the printed circuit board which is often unavailable or difficult to locate, and also without the need for costly scratch pads which would be rendered ineffective by heat sink devices. The present access device unit for pin grid arrays makes possible the probe access of each pin of the pin grid array on an easily located and certain basis through the use of the described thin flexible film unit which is easily placed on the underside of the pin grid array when it mates to the printed circuit board.

While the access device unit has been described in its preferred embodiment, it is understood that other variations and versions of the concept may be effectuated but which may still fall within the terms of the following claims which define the subject matter of this disclosure.

What is claimed is:

1. A flexible dielectric film access device unit for use in contacting and electrically testing the underside pins of a pin grid array of an integrated circuit unit mounted on a circuit board, said mounted pin grid array having a plurality of underside connection pins arranged in a patterned array to which said access device unit provides matching interior contact pads, said access device unit comprising, in combination:
   (a) a flexible dielectric film having a thickness no greater than 5 mils and providing a plurality of said interior contact pads directly underneath said integrated circuit unit, said dielectric film area, directly under said integrated circuit unit, being designated as an interior area and residing under the under surface of said pin grid array, said film including a plurality of exterior areas which extend beyond the under surface of said pin grid array, and said dielectric film including microstrip conductive lines on one side thereof for connecting corresponding interior contact pads to corresponding exterior contact pads;
   (b) said plurality of electrical interior contact pads located on said interior area to align and connect with each individual pin of said pin grid array for non-solder contact, and wherein each of said interior contact pads is formed of an inner flexible dielectric which is plated on both sides with conductive copper and having intersecting central slits of width slightly less than the diameter of the pins on said pin grid array;
   (c) said plurality of electrical exterior contact pads located on each of said plurality of exterior areas, each of said exterior contact pads being electrically connected to a coresponding one of said interior contact pads via said microstrip conductive lines, and wherein each of said exterior contact pads includes indicia which identify its connection to a specific one of said interior contact pads.

2. The access device unit of claim 1, wherein said flexible dielectric film is made of polyimide having a thickness less than 5 mils.

3. An access device unit for use in contacting and electrically testing the underside pins of a pin grid array of an integrated circuit unit mounted on a circuit board, said mounted pin grid array having a plurality of underside connection pins arranged in a patterned array to which said access device unit provides matching interior contact pads, said access device unit comprising, in combination:
   (a) a flexible dielectric film having a plurality of interior contact pads located for non-solder contact with each pin of said pin grid array, and wherein each of said interior contact pads includes intersecting central slits whose common intersection point is aligned on the axis of each pin of said pin grid array, each said interior contact pad including:
     (i) a central flexible dielectric having upper and lower surfaces;
     (ii) a conductive copper layer covering said flexible dielectric on said upper and lower surfaces;
     (iii) a layer of nickel coating covering said conductive copper layer;
     (iv) a layer of gold covering said layer of nickel coating;
   and said dielectric film including:
     (a1) a plurality of exterior flap extension means having a plurality of said exterior contact pads of equal number to said interior contact pads, each of said extension means extending beyond the under surface area of said pin grid array of said integrated circuit unit;
     (a2) microstrip electrical line connection means connecting each of said interior contact pads to a corresponding one of said exterior contact pads.

4. The access device unit of claim 3, wherein said flexible dielectric film is made of polyimide less than 5 mils in thickness, and wherein said copper coating is 1 mil in thickness, said nickel coating is 0.05 mils thick and said gold covering is 0.03 mils thick.

5. The access device unit of claim 3, wherein said exterior flap extension means includes:
   (a) identification means for identifying each said exterior contact pads for correlating its connection to each of said interior contact pads.

6. The access device unit of claim 3, wherein said flap extension means includes:
   (a) four extension flaps extending at right angles to each other beyond the under surface of said pin grid array, said four extension flaps including said exterior contact pads which are joined by said microstrip line connections to said interior contact pads;
   (b) a patterned arrangement of rows and columns for said exterior contact pads on each said extension flap wherein each contact pad has identifying indicia for organizing said plurality of exterior contact pads to enable visual correlation of each said exterior pad to a specific one of said interior pads.

7. The access unit of claim 6, wherein said arrangement of rows and columns includes:
   (a) indicia means for identifying the row and column of each said exterior contact pad.

8. The access device unit of claim 6, wherein each of said extension flaps is flexibly movable away from said underside of said pin grid array.

9. The access device unit of claim 3, wherein said interior contact pad has a circular land area 60 mils in diameter, and said intersecting central slits are 4 mils in width for allowing penetration by each of said underside connection pins to provide a resilient non-solder electrical contact between said underside pin and said interior contact pad.

* * * * *